United States Patent [19]
Cha et al.

[11] Patent Number: 5,783,022
[45] Date of Patent: Jul. 21, 1998

[54] APPARATUS AND METHODS FOR WAFER DEBONDING USING A LIQUID JET

[75] Inventors: Gi-ho Cha; Byoung-hun Lee, both of Kyungki-do, Rep. of Korea

[73] Assignee: Samsung Electronics Co., Ltd., Rep. of Korea

[21] Appl. No.: 742,938

[22] Filed: Oct. 31, 1996

[30] Foreign Application Priority Data

Oct. 31, 1995 [KR] Rep. of Korea ............... 1995-39045

[51] Int. Cl.6 ........................................ B32B 35/00
[52] U.S. Cl. .................. 156/344; 156/584; 29/426.3; 29/426.5; 29/239; 134/59; 134/137; 134/902
[58] Field of Search ..................... 156/344, 584; 29/426.3, 426.5, 239; 134/34, 59, 137, 902

[56] References Cited

U.S. PATENT DOCUMENTS

| | | | |
|---|---|---|---|
| 4,224,504 | 9/1980 | Erikson et al. | 219/388 |
| 4,466,852 | 8/1984 | Beltz et al. | 156/344 |
| 5,091,331 | 2/1992 | Delgado et al. | 437/62 |
| 5,102,821 | 4/1992 | Moslehi | 438/456 |
| 5,131,968 | 7/1992 | Wells et al. | 156/153 |
| 5,213,451 | 5/1993 | Frank et al. | 406/72 |
| 5,502,316 | 3/1996 | Kish et al. | 257/94 |
| 5,517,047 | 5/1996 | Linn et al. | 257/347 |
| 5,661,316 | 8/1997 | Kish, Jr. et al. | 257/190 |

*Primary Examiner*—Mark A. Osele
*Attorney, Agent, or Firm*—Myers Bigel Sibley & Sajovec, P.A.

[57] ABSTRACT

Wafer debonding of a bonded bulk wafer and a device wafer using a liquid jet to avoid scratching of the wafers is provided. The wafer debonder includes a wafer loader having a first stand with a flat upper surface and a second stand located above the first stand having a lower surface slanted with respect to the upper surface of the first stand at a predetermined angle. A first holder is connected to the first stand and a second holder is located on an imaginary surface extended from the lower surface of the second stand for holding the wafers. A liquid jetting nozzle is positioned adjacent the wafer loader to direct a jet of liquid at the interface between the wafers to separate the wafers.

19 Claims, 3 Drawing Sheets

APPARATUS AND METHODS FOR WAFER DEBONDING USING A LIQUID JET

FIELD OF THE INVENTION

This invention relates to semiconductor fabricating apparatus and methods, and more particularly to wafer debonders for use in semiconductor fabricating.

BACKGROUND OF THE INVENTION

Integrated circuits fabricated in silicon-on-insulator ("SOI") substrates offer various performance advantages. A commercially fabricated silicon-on-insulator wafer may be generally classified into one of two types. A SIMOX (separation by implanted oxygen) wafer is one type which generally includes an oxide layer in a bulk wafer which is obtained by implanting oxygen ions in the bulk wafer and then annealing the wafer. The second type is a bonded SOI wafer which may be produced by forming a thermal oxide layer on the surface of a bulk wafer and then directly bonding a device wafer on the thermal oxide layer.

In the case of the bonded SOI wafer, if impurity particles exist in the interface between the bulk wafer and the device wafer after the bonding process, the device may be useless commercially. Therefore, the bonding process is generally performed in a super-clean room in order to attempt to prevent the interface between the bulk wafer and the device wafer from being contaminated by impurity particles. However, in practice, it is generally not possible to carry out a bonding process without generating some impurity particles. Therefore, in some cases, impurity particles exist in the interface between the wafers after bonding the device wafer to the bulk wafer. As a result, if impurity particles exist, a debonding process may be provided to allow removal of the impurity particles.

FIGS. 1A and 1B are cross-sectional views illustrating a conventional wafer debonding method. As illustrated in FIG. 1A, after forming thermal oxide layer 30 on bulk wafer 10, device wafer 20 is directly bonded on thermal oxide layer 30 to form bonded wafer 60. If it is determined that impurity particles exist in the interface between bulk wafer 10 and device wafer 20 requiring debonding, razor blade 40 is inserted between bulk wafer 10 and device wafer 20, and the bonded wafers are debonded manually by hands 50 as shown in FIG. 1B.

With the conventional method of debonding as illustrated in FIGS. 1A and 1B, while the thickness of each of bulk wafer 10 and device wafer 20 is thin, the bonding strength between the wafers is typically too strong to separate the wafers with bare hands alone. Therefore, razor blade 40 is inserted as an auxiliary tool for debonding bonded wafer 60.

However, razor blade 40 may cause undesirable scratches around edges of bulk wafer 10 and device wafer 20, causing a scratch in the surfaces of the wafers. Since this scratch typically can not be eliminated even if the debonded wafers are rebonded after cleaning, the wafers having a scratch may need to be discarded, thereby increasing processing costs.

SUMMARY OF THE INVENTION

Accordingly, it is an object of the present invention to provide wafer debonders and methods for using the same which are capable of debonding wafers which are bonded to each other without scratching the surface of either wafer.

This and other objects are provided according to the present invention by a wafer debonder in which a pressurized liquid jet is directed at the interface between the bonded wafers with sufficient pressure to overcome the wafer bonding and separate the two wafers. A loader is provided to hold the bonded wafer in position while a liquid jet is applied and to hold the two respective separate wafers after they have been debonded. This is accomplished by providing a wafer loader for positioning the bonded wafer to be separated and a liquid jetting nozzle positioned adjacent the wafer loader to direct a jet of liquid at the interface to separate the first wafer from the second wafer of the bonded wafer pair.

In one embodiment of the present invention, a wafer debonder is provided which includes a wafer loader having a first stand with a flat upper surface and a second stand located above the first stand, with a lower surface slanted with respect to the upper surface of the first stand at a predetermined angle. A liquid jetting nozzle is provided positioned relative to the flat upper surface of the first stand and the slanted lower surface of the second stand so as to direct a jet of liquid between the surfaces.

In another aspect of the present invention, a first holder is provided positioned adjacent the first stand. The first holder holds a bonded wafer to be debonded in place on the upper surface of the first stand. A second holder is provided positioned adjacent the second stand. The second holder holds one of the wafers of the bonded wafer after debonding in place relative to the lower surface of the second stand.

In another embodiment of the wafer debonder of the present invention, the upper surface of the first stand has a length approximately two-thirds of the length of the wafer to be debonded, and the lower surface of the second stand has a length approximately one-third of the length of the wafer to be debonded. The predetermined angle between the lower surface of the second stand and the upper surface of the first stand in one embodiment of the present invention is between about 3° and about 5°.

In another aspect of the wafer debonder of the present invention, the first and second holders are vacuum chucks, and the nozzle is in a pin-type or plate-type nozzle.

A method for wafer debonding using a liquid jet is also provided. The method includes jetting a liquid toward the interface between the bonded wafers at a jetting pressure greater than the bonding strength between the first wafer and the second wafer to separate the wafers.

In one embodiment of the methods of the present invention, the step of jetting a liquid towards the interface is performed at a jetting pressure which is at least twice the bonding strength between the first wafer and the second wafer. The liquid used may be deionized water.

In another embodiment of a wafer debonding method according to the present invention, the bonded wafer is loaded into a wafer loader. The first wafer of the bonded wafer is held in a substantially fixed position in the wafer holder. A nozzle is positioned adjacent the wafer loader on a imaginary line extended from the interface between the first and second wafer of the bonded wafer. A liquid, for example, deionized water, is jetted from the nozzle towards the interface to separate the second wafer and the first wafer, and the separated second wafer is held in the wafer loader after it is separated.

The wafer bonding apparatus and methods of the present invention provide for debonding of wafers without the scratching problems caused by the conventional method of separating wafers using a razor blade. As a result, the problem of scratches being placed on the respective wafers during the debonding operation may be avoided using the apparatus and methods of the present invention to provide for wafer debonding with reduced processing costs due to reduced loss of parts.

DETAILED DESCRIPTION OF THE PREFERRED EMBODIMENTS

Figure 1B:
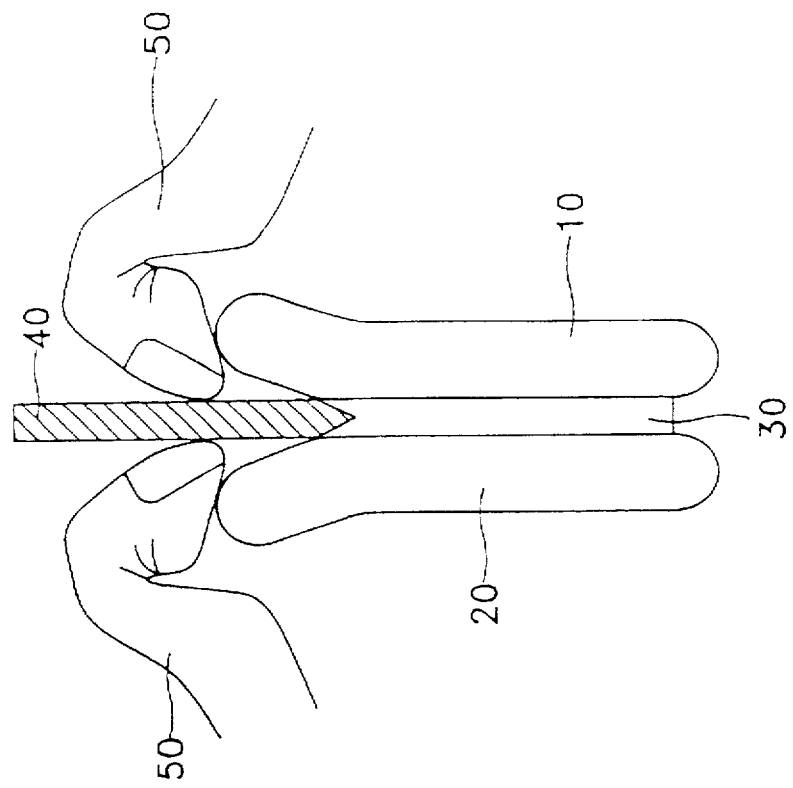
FIGS. 1A and 1B are cross-sectional views illustrating a conventional wafer debonding method.
Figure 1A:
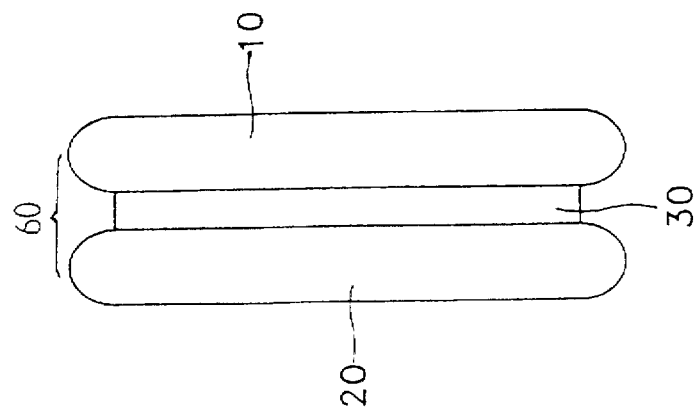

The present invention will now be described more fully hereinafter with reference to the accompanying drawings, in which preferred embodiments of the invention are shown. In the drawings, the thickness of layers and regions are exaggerated for clarity. Like numbers refer to like element throughout. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 2:
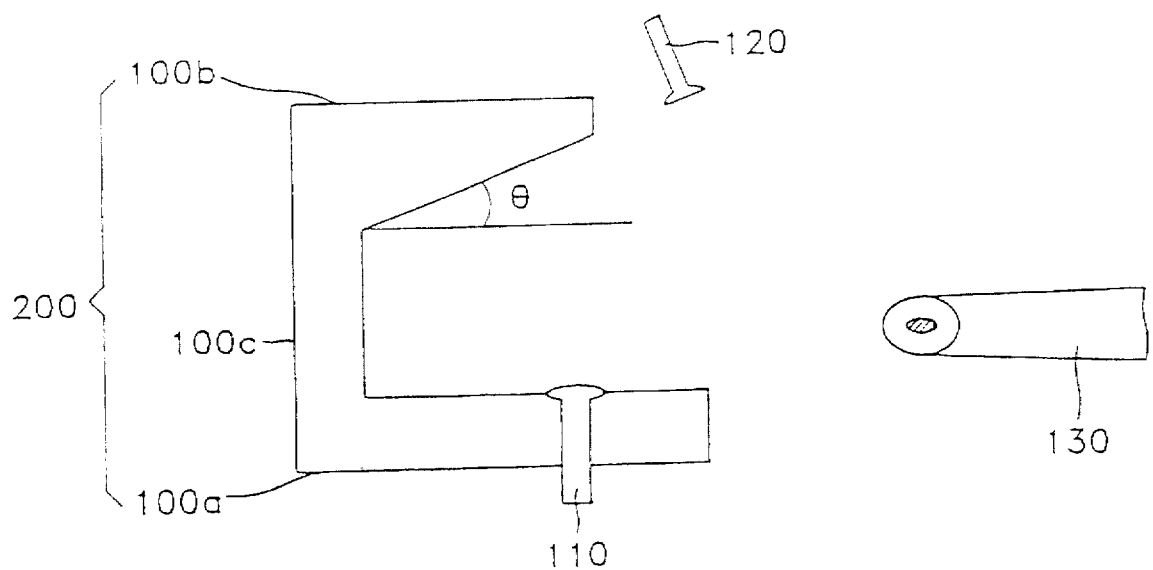
FIG. 2 is a cross-sectional view illustrating an embodiment of a wafer debonder according to the present invention.

Referring to FIG. 2, an embodiment of a wafer debonder according to the present invention is illustrated. As illustrated in FIG. 2, the wafer debonder includes wafer loader 200 having first stand 100a with a flat upper surface and a second stand 100b located above first stand 100a, with a lower surface slanted with respect to the upper surface of the first stand 100a at a predetermined angle (θ). Connector 100c connects first stand 100a and second stand 100b. First holder 110 is positioned adjacent first stand 100a to hold a bonded wafer in place on the flat upper surface of first stand 100a. As illustrated in FIG. 2, first holder 110 is connected to first stand 100a. Second holder 120 is positioned adjacent second stand 100b to hold a wafer which has been debonded in place on the lower surface of second stand 100b. As illustrated in FIG. 2, second holder 120 is located on an imaginary surface extended from the lower surface of second stand 100b. Nozzle 130 is installed in front of wafer loader 200.

As illustrated in FIG. 2, first stand 100a has a length approximately two-thirds of the length of a wafer (not shown) to be debonded loaded in wafer loader 200. Second stand 100b has a length approximately one-third of the length of a wafer (not shown) to be debonded. Also, as illustrated in FIG. 2, the lower surface of second stand 100b is positioned adjacent the upper surface of first stand 100a and extends at a predetermined angle (θ) relative to the upper surface of first stand 100a of between about 3° and about 5°.

As illustrated in FIG. 2, first and second holders 110 and 120 are vacuum chucks. First holder 110 holds a wafer to be debonded while second holder 120 holds a debonded wafer. In other words, when debonding a bonded bulk wafer and device wafer (not shown), first holder 110 holds the bonded wafer and second holder 120 holds the device wafer after it is debonded from the bulk wafer. After the device wafer is debonded from the bulk wafer, the bulk wafer continues to be held by first holder 110.

Nozzle 130 is preferably a pin-type or a plate-type nozzle. The bonded bulk wafer and device wafer are debonded by jetting a liquid, such as water, at a jetting pressure greater than the bonding strength of the bonded wafer toward the interface between the bulk wafer and device wafer. A jetting pressure of the liquid of at least twice the bonding strength of the bonded wafer may be used according to the present invention and deionized water can be used as the liquid. A liquid supply means (not shown) supplies the jet of liquid to nozzle 130 at a pressure sufficient to separate the bulk wafer and the device wafer.

Figure 3A:
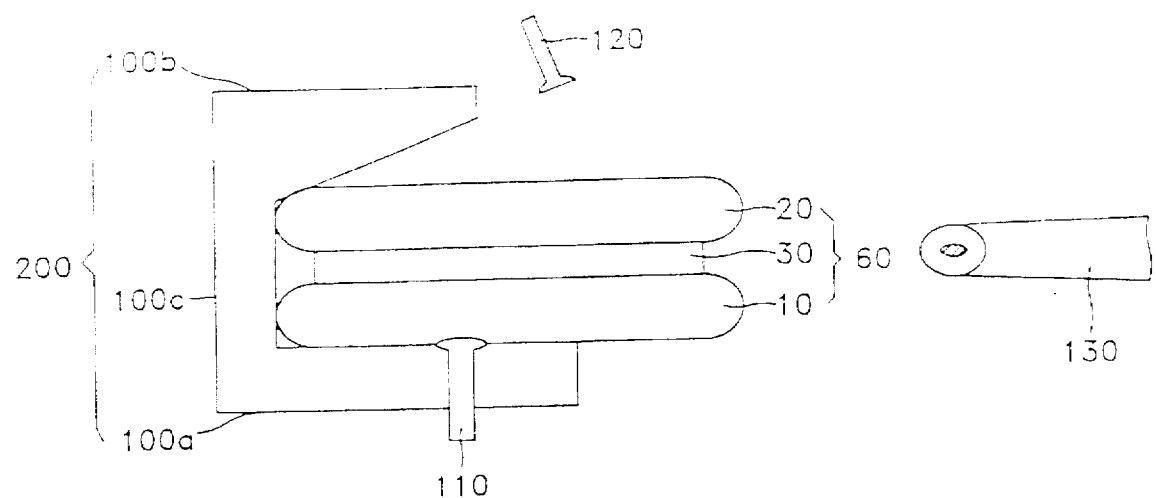
FIGS. 3A and 3B are cross-sectional views illustrating an embodiment of a wafer debonding method according to the present invention.
Figure 3B:
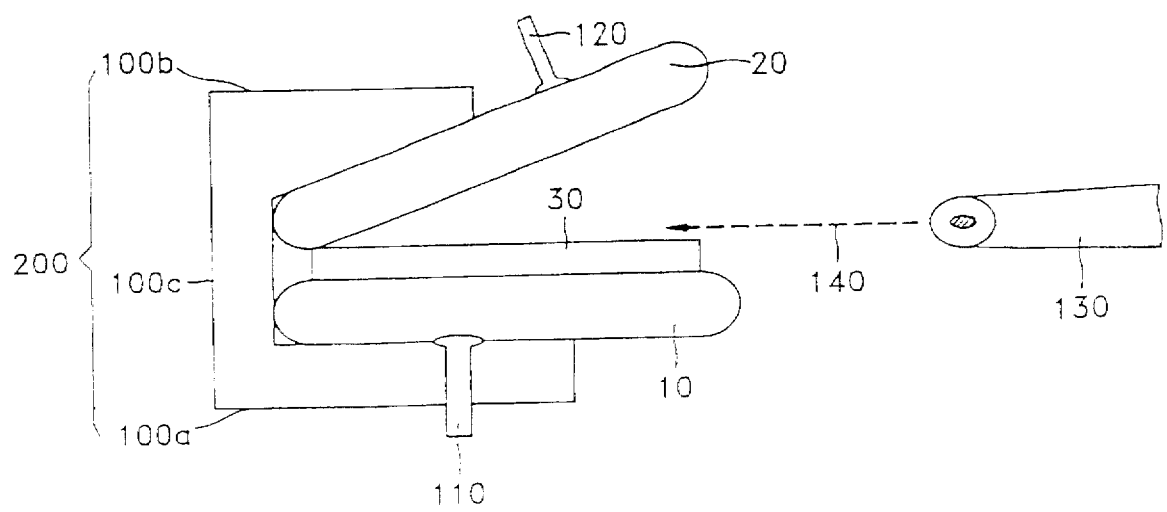

FIGS. 3A and 3B are cross-sectional views illustrating an embodiment of a wafer debonding method of the present invention, wherein the wafer debonder shown in FIG. 2 is used. FIG. 3A illustrates the process of loading a bonded wafer into the wafer debonder. After forming a thermal oxide layer 30 on a bulk wafer 10, a device wafer 20 is directly bonded on the thermal oxide layer 30 to form a bonded wafer 60. If it is determined that impurity particles exist in the interface between bulk wafer 10 and device wafer 20, bonded wafer 60 is loaded onto first stand 100a of wafer loader 200. Bonded wafer 60 on first stand 100a is then held in position by first holder 110.

FIG. 3B illustrates the process of debonding bonded wafer 60. First, nozzle 130 is placed in front of wafer loader 200 and adjusted to be located on an imaginary line extended from the interface of bonded wafer 60. Second, a liquid 140 is jetted from nozzle 130 toward the interface of the two wafers of the bonded wafer to thereby separate or debond device wafer 20 from bulk wafer 10. After debonding, debonded device wafer 20 is held in position by second holder 120.

When bonded wafer 60 is loaded in the wafer debonder in the opposite direction to that shown in FIG. 3A, the debonding method of the present invention may also be used to debond bulk wafer 10 from device wafer 20 as will be understood by those skilled in the art.

As described above with respect to the apparatus of the present invention, deionized water may be used as liquid 140. Furthermore the jetting pressure of the liquid may be at least twice the bonding strength between bulk wafer 10 and device wafer 20.

Wafers debonded through the above steps illustrated with reference to FIGS. 3A and 3B may thereafter be cleaned to remove impurity particles therefrom and then reused. Therefore, according to a wafer debonder and a wafer debonding method using a wafer debonder of the present invention, deionized water is jetted toward the interface of two bonded wafers to debond the wafers. As a result, scratches which may be caused by the use of a razor blade as in prior art methods may be avoided using the methods and apparatus of the present invention. Furthermore, a wafer cleaning process may be performed by the liquid jet simultaneously with the debonding process using the present invention.

In the drawings and specification, there have been disclosed typical preferred embodiments of the invention and, although specific terms are employed, they are used in a generic and descriptive sense only and are not for purposes of limitation, the scope of the invention being set forth in the following claims.

That which is claimed is:

1. A wafer debonder which separates a bonded wafer having a first wafer and a second wafer bonded to said first wafer at an interface comprising:

a wafer loader which positions said bonded wafer;

a liquid jetting nozzle positioned adjacent said wafer loader to direct a jet of liquid at said interface to separate said first wafer from said second wafer; and wherein said wafer loader comprises:

a first stand having a surface for positioning said bonded wafer;

a second stand having a surface positioned adjacent said surface of said first stand and extending at a predetermined angle relative to said surface of said first stand, said liquid jetting nozzle being positioned so as to direct a jet of liquid between said surface of said first stand and said surface of said second stand; and a first holder positioned adjacent said first stand to hold a bonded wafer in place on said surface of said first stand.

2. The wafer debonder of claim 1 wherein said wafer loader further comprises a second holder positioned adjacent said second stand to hold a wafer which has been debonded in place on said surface of said second stand.

3. The wafer debonder of claim 2 wherein said surface of said first stand has a length approximately two-thirds of the length of the wafer to be debonded and wherein said surface of said second stand has a length approximately one-third of the length of the wafer to be debonded.

4. The wafer debonder of claim 2 wherein said predetermined angle is between about 3° and about 5°.

5. The wafer debonder of claim 2 wherein said first holder and said second holder are vacuum chucks.

6. The wafer debonder of claim 2 wherein said liquid jetting nozzle is a pin nozzle.

7. The wafer debonder of claim 2 wherein said liquid jetting nozzle is a plate nozzle.

8. The wafer debonder of claim 2 wherein said first holder is connected to said first stand and wherein said second holder is positioned on an imaginary surface extended from said surface of said second stand.

9. A wafer debonding method for separating a bonded wafer having a first wafer and a second wafer bonded to said first wafer at an interface, said method comprising the steps of:

loading the bonded wafer into a wafer loader;

holding the first wafer of the bonded wafer in a substantially fixed position in said wafer loader;

positioning a nozzle adjacent the wafer loader on an imaginary line extended from the interface;

jetting a liquid from the nozzle toward the interface to separate the second wafer and the first wafer; and, holding the separated second wafer in said wafer loader.

10. The wafer debonding method of claim 9 wherein said step of jetting a liquid comprises the step of jetting a liquid toward the interface at a jetting pressure which is at least twice the bonding strength between the first wafer and the second wafer to separate the wafers.

11. The wafer debonding method of claim 9 wherein said step of jetting a liquid comprises the step of jetting deionized water toward the interface at a jetting pressure greater than the bonding strength between the first wafer and the second wafer to separate the wafers.

12. A wafer separator which separates a first wafer and a second wafer at an interface therebetween comprising:

a wafer loader which positions said first wafer and said second wafer;

a liquid jetting nozzle positioned adjacent said wafer loader to direct a jet of liquid at said interface to separate said first wafer from said second wafer;

a jet of liquid that is supplied from said liquid jetting nozzle at a pressure sufficient to separate said first wafer from said second wafer; and wherein said wafer loader further comprises a first holder positioned in said wafer loader so as to hold said first wafer in place in said wafer loader.

13. The wafer separator claim 12 wherein said wafer loader comprises:

a first stand having a surface for positioning said bonded wafer;

a second stand having a surface positioned adjacent said surface of said first stand and extending at a predetermined angle relative to said surface of said first stand, said liquid jetting nozzle being positioned so as to direct a jet of liquid between said surface of said first stand and said surface of said second stand; and wherein said first holder is positioned adjacent said first stand to hold said first wafer in place on said surface of said first stand.

14. The wafer separator of claim 13 wherein said wafer loader further comprises a second holder positioned adjacent said second stand to hold said second wafer in place on said surface of said second stand after said first wafer and said second wafer are separated.

15. The wafer separator of claim 14 wherein said first holder and said second holder are vacuum chucks.

16. The wafer separator of claim 14 wherein said first holder is connected to said first stand and wherein said second holder is positioned on an imaginary surface extended from said surface of said second stand.

17. A wafer separating method for separating a first wafer and a second wafer at an interface therebetween, said method comprising the steps of:

loading the first wafer and the second wafer into a wafer loader;

holding the first wafer in a substantially fixed position in said wafer loader; and jetting a liquid from a nozzle toward the interface to separate the second wafer and the first wafer.

18. The wafer separating method of claim 17 further comprising the step following said jetting step of holding the separated second wafer in said wafer loader.

19. The wafer separating method of claim 17 further comprising the step preceding said jetting step of positioning a nozzle adjacent the wafer loader on an imaginary line extended from the interface.

* * * * *